United States Patent [19]

Suzuki

[11] Patent Number: 5,204,224

[45] Date of Patent: Apr. 20, 1993

[54] METHOD OF EXPOSING A PERIPHERAL PART OF A WAFER

[75] Inventor: Shinji Suzuki, Kawasaki, Japan

[73] Assignee: Ushio Denki, Tokyo, Japan

[21] Appl. No.: 734,077

[22] Filed: Jul. 22, 1991

Related U.S. Application Data

[63] Continuation of Ser. No. 617,243, Nov. 21, 1990, abandoned, which is a continuation of Ser. No. 360,699, Jun. 2, 1989, abandoned.

[30] Foreign Application Priority Data

Sep. 26, 1988 [JP] Japan ............................ 63-238894

[51] Int. Cl.⁵ .................................... G03F 7/20
[52] U.S. Cl. .................................. 430/315; 430/322; 430/327; 430/328; 430/330
[58] Field of Search ............... 430/315, 322, 327, 328, 430/330

[56] References Cited

U.S. PATENT DOCUMENTS 4,868,095 9/1989 Suzuki et al. ..................... 430/326

FOREIGN PATENT DOCUMENTS 0123153 3/1984 European Pat. Off. .
56-40826 9/1981 Japan .
58-92221 8/1983 Japan .
58-139144 11/1983 Japan .
59-138335 12/1984 Japan .
60-60724 8/1985 Japan .

Primary Examiner—Marion E. McCamish
Assistant Examiner—Kathleen Duda
Attorney, Agent, or Firm—Nikaido, Marmelstein, Murray & Oram

[57] ABSTRACT

A method of exposing a peripheral part of the wafer is used for a fine pattern formation process in the processing of ICs, LSIs and other electronic elements, to remove, in a development step, an unnecessary portion of a photoresist coated on a semiconductor substrate, typically a silicon wafer, or a substrate consisting of a dielectric, a metal or an insulator. A peripheral part of the wafer is exposed to light led by an optical fiber light guide. The same area is exposed to light at least twice in a predetermined time interval. The illumination intensity of light in a wavelength range necessary for the first exposure is set to be lower than that for the second and following exposures. In the first exposure, the wafer may be held in a heated state.

3 Claims, 2 Drawing Sheets

METHOD OF EXPOSING A PERIPHERAL PART OF A WAFER

This application is a continuation of application Ser. No. 617,243 filed Nov. 21, 1990, now abandoned which is Rule 1.60 continuation application of Ser. No. 360,699 filed Jun. 2, 1989, now abandoned.

BACKGROUND OF THE INVENTION

1. Field of the Invention

This invention relates to a method of exposing a peripheral part of wafer which is used for a fine pattern formation process in the production of ICs, LSIs and other electronics elements. More this particularly, this invention relates to removing, in a development step, an unnecessary portion of a photoresist coated on a semiconductor substrate, typically a silicon wafer, or a substrate consisting of a dielectric, a metal or an insulator.

2. Description of the Prior Art

In the manufacture of ICs and LSIs, for forming a fine circuit pattern, a photoresist pattern is formed by coating a photoresist on a silicon wafer or the like and exposing and developing the coated photoresist. The photoresist pattern thus formed is used as a mask to effect ion implantation, etching, lifting-off and other steps.

Usually, the photoresist is coated by spin coating. In the spin coating process, the wafer is spun while pouring photoresist onto the center position of the right side of the wafer. The poured photoresist is coated on the wafer by centrifugal forces. In this spin coating process, however, the photoresist is spun off a peripheral part of the wafer and is brought to the wrong side of the wafer.

FIG. 2 is a cross sectional view showing a photoresist coated on a wafer. In the Figure, reference numeral 1 designates a wafer, 1p a peripheral part of the wafer, 1a a photoresist portion on a pattern formation part of the wafer, 1b a photoresist portion on a peripheral part 1p, and 1c a photoresist portion brought to the wrong side of the wafer 1 from the edge thereof. The photoresist portion 1c brought to the wrong side of the wafer is not illuminated in an exposure step for pattern formation, and if it is a positive photoresist, it remains after the development.

FIG. 3 is a typical view showing a circuit pattern formed by exposure on the wafer. Each area labeled T corresponds to one circuit pattern. In a peripheral part of wafer, a correct circuit pattern can not be formed in many cases, or it can be formed with a inferior yield. The photoresist portion 1b on a peripheral part of wafer is substantially unnecessary in the circuit pattern formation. Even if the peripheral part of wafer is exposed by a stepper, the photoresist remains unnecessarily after the development.

The remains of unnecessary photoresist coated on the peripheral part and brought to the wrong side of the wafer gives rise to the following problem. The wafer with the coated photoresist is conveyed in various steps and by various systems or units. A peripheral part of the wafer thus is sometimes mechanically chucked and sometimes rubs a wall of wafer cassette or like wafer accommodation means. In such cases, the unnecessary photoresist portion on the peripheral part of wafer is liable to be removed and re-attached to a pattern formation portion of the wafer. In this case, correct pattern formation can no longer be obtained, thus reducing the yield.

The fact that the unnecessary photoresist remaining on the peripheral part of wafer becomes "refuse" to reduce the yield poses significant problems particularly in view of the recent trend for higher functional levels and finer patterns in ICs.

For removing the unnecessary photoresist remaining on the peripheral part of wafer, a technique of removing the photoresist by a solvent spray method is in practical use.

In this method, the solvent is sprayed on the wrong side of the peripheral part of the wafer, solving the unnecessary photoresist. In this method, however, although the photoresist 1c as shown in FIG. 2 can be removed, the unnecessary photoresist 1b on the right side of the peripheral part of wafer can not be removed. Further, if it is arranged such that the solvent is sprayed on the right side of wafer 1 for removing the unnecessary photoresist 1b, not only does there arise a problem caused by scattering of the solvent, it is impossible to remove only the unnecessary photoresist with high controllability. Also, it is impossible to provide for a sharp borderline between the unnecessary photoresist 1b on the peripheral part of wafer and photoresist 1a on the pattern formation part of wafer which is necessary as a mask layer for a subsequent etching or an ion implantation process.

Recently, it has been in practice to expose the unnecessary photoresist on the peripheral part of wafer to remove it in the development process in addition to the exposure step for pattern formation of the wafer so called "photolithography".

In this peripheral part of the wafer exposure method, the borderline between the unnecessary photoresist 1b on the peripheral part of wafer and photoresist 1a necessary for the pattern formation as a mask layer for a subsequent ion implantation process or the like, as shown in FIG. 2, can be sharp and with high controllability, so that this method is superior to the solvent spray method.

In the above prior art of peripheral part exposure method, if the photoresist is irradiated with strong ultraviolet rays from the outset to shorten exposure time, gases that are generated by decomposition and evaporation of organic solvents contained in the photoresist or photochemical reaction of photoresist thereof are not emitted to the outside but becomes bubbles within the photoresist.

If such a bubble formation occurs, the portions with bubbles are spattered when the wafer rubs a wall of a wafer cassette or the like. The spattered photoresist is attached as "refuse" to the pattern formation part of the wafer to bring about the problem of pattern defects as noted above.

SUMMARY OF THE INVENTION

An object of the invention is to provide a method of exposing a peripheral part of wafer, which is free from generation of bubbles in the photoresist and also free from pattern defects and which permits high yield and productivity to be obtained.

According to the invention, in a first exposure the illumination intensity is set to a low level so that gases generated in the photoresist material will not be concentrated in any area but are emitted to the outside of the photoresist material at a low rate. Thus, no bubbles are formed in the photoresist material. In the second exposure, the illumination intensity can be increased without possibility of bubble formation because gases produced in the first exposure have been liberated from the photoresist material during the time interval between the first exposure and the second exposure. In the second and following exposures the turning speed of the wafer can be increased to shorten the exposure time.

More specifically, in a method of exposing a peripheral part of the wafer according to the invention, the light passes through an optical fiber light guide irradiates a small portion of a peripheral part of the wafer by turns while the wafer is turning, and irradiates a whole portion of a peripheral part of the wafer after the wafer turned 360 degrees. Then, if the above procedure is practised in two turns, any small portion of a peripheral part of the wafer would be irradiated twice in a predetermined time interval while the wafer is turning. The illumination intensity for the first exposure is set to be lower than that for the second and following exposures. Thus, no bubbles are formed to obtain high yield of product.

Further, the productivity can be improved by increasing the turning speed of the wafer and increasing the number of optical fiber light guides that are used.

DESCRIPTION OF THE PREFERRED EMBODIMENT

This invention will be described hereinafter on the basis of embodiments shown in the accompanying drawings.

Figure 1:
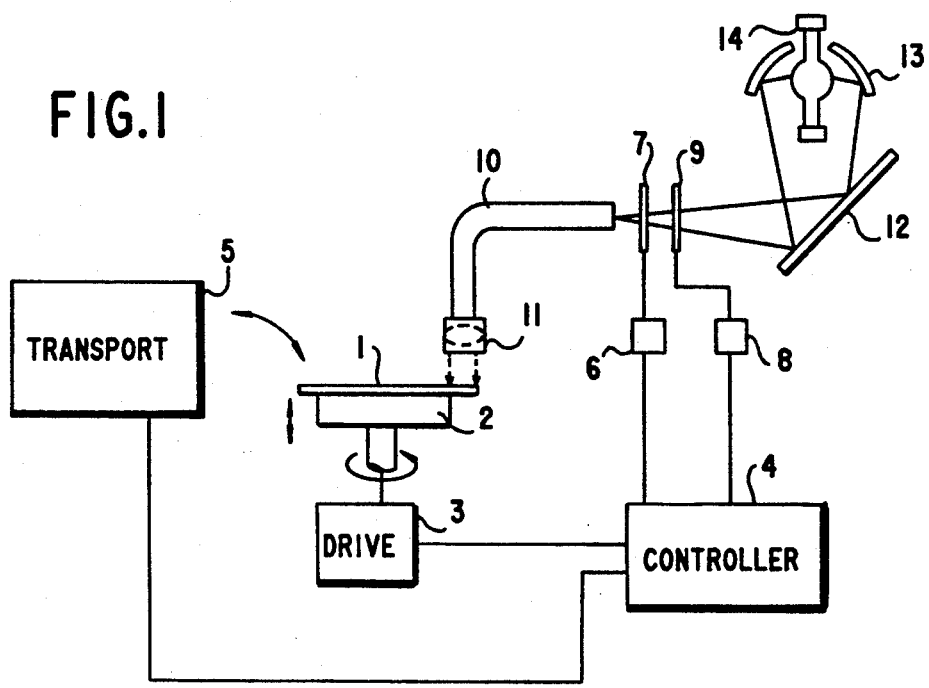
FIG. 1 is a schematic representation of a main portion of an exposure apparatus for carrying out an embodiment of a peripheral part of the wafer exposure method according to the invention.

FIG. 1 schematically shows a main portion of an exposure apparatus for carrying out one embodiment for a method of exposing a peripheral part of wafer 1 according to the invention. Referring to the Figure, reference numeral 1 designates a wafer, 2 is a stage, on which the wafer 1 is set, 3 is a stage drive system for turning the stage 2, 4 is a system controller, 5 is a wafer transport system for transporting the wafer 1 onto the stage 2, 6 is a shutter actuator, 7 is a shutter opened and closed by the shutter actuator 6, 8 is a light-reducing filter actuator, 9 is a light-reducing filter consisting of a metal mesh or the like to control the transmission of exposure light, 10 is an optical fiber light guide for guiding exposure light, by which a small portion of a peripheral part of the wafer 1 is lit. 11 is a light emission end of the optical fiber light guide, 12 is a plane mirror, 13 is an oval light collector, and 14 is a discharge mercury lamp of short arc type (hereinafter referred to as lamp). The shutter actuator 6 and light filter actuator 8 may use rotary solenoids, for instance.

An example of the exposure method using the exposure apparatus shown in FIG. 1 will now be described.

The wafer transport system 5 transports the wafer 1 and sets it on the stage 2 according to a signal from the system controller 4. The stage 2, on which the wafer 1 is set, chucks the wafer 1 by a vacuum chuck mechanism (not shown). Subsequently, the stage 2 is caused to turn, and the shutter 7 is opened by the shutter actuator 6 according to a signal from the system controller 4. At this time, the light-reducing filter 9 remains in the light path. Light from the lamp 14 is reduced by the filter 9 and emitted from the light emission end 11 of the optical fiber light guide 10 to effect exposure of the peripheral part of the wafer 1.

This exposure is done at reduced illumination intensity and is called the first exposure. The first exposure continues while wafer 1 turns 360 degrees(1 cycle).

The end of the first exposure is monitored by a monitoring mechanism for turning angle(not shown, such as a counter for counting the number of pulses of a pulse motor for the stage driving system 3, or a rotary encoder).

The result of this monitoring is transmitted to the system controller 4. Monitoring the wafer 1 as it turns 360 degrees(finishing the first exposure), system controller 4 sends a signal to filter actuator 8 to remove filter 9 from the light path. Then the second exposure starts. From the end of the first exposure to the start of the second exposure, the turning motion of wafer 1 may be continued or stopped. If the turning motion is stopped, the shutter 7 is inserted into the light-path.

In the second exposure, the peripheral part of wafer 1 is exposed at the higher illumination intensity because the light-reducing filter 9 is removed from the light-path.

When the second exposure finishes, the wafer 1 is transported from the stage 2 to a wafer cassette by the wafer transport system 5, and the photoresist on the peripheral part of the wafer is removed in a development process by well-known means.

Figure 4A:
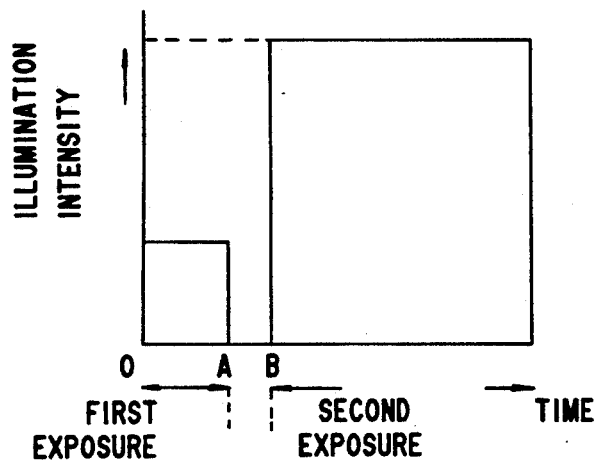
FIGS. 4(a) and 4(b) are graphs showing the relation between the illumination intensity and the turn time of 360 degrees in the exposure method according to the invention.
Figure 4B:
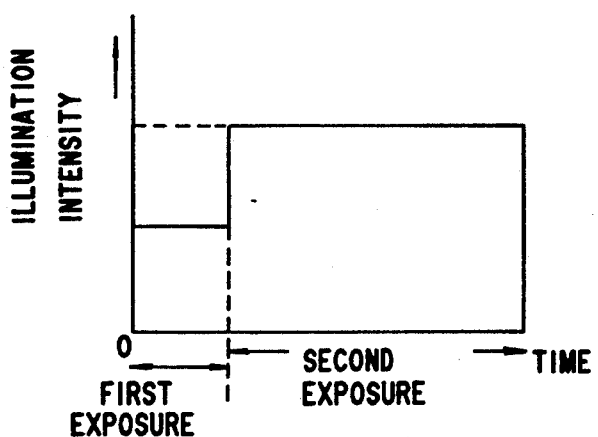
Figure 2:
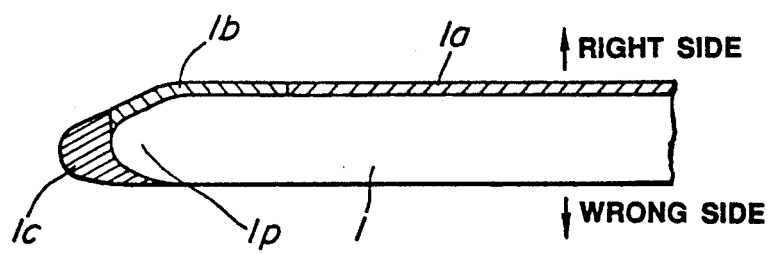
FIG. 2 is a cross sectional view showing photoresist coated on a wafer.
Figure 3:
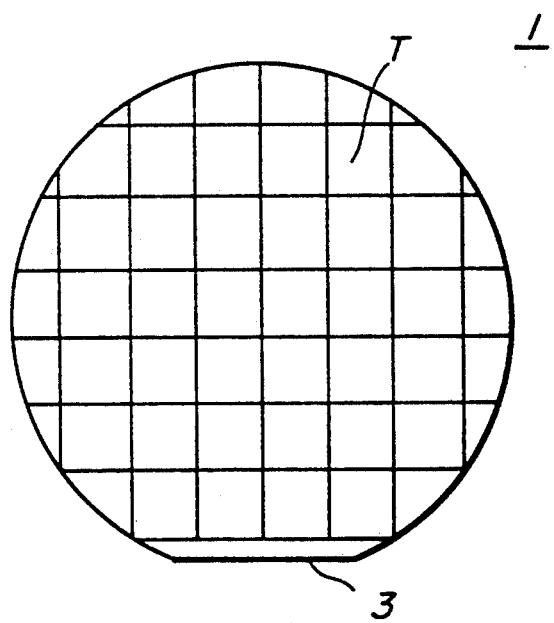
FIG. 3 is a typical view showing the shape of an exposed circuit pattern on the wafer.

In FIG. 4(a) and 4(b), the illumination intensity in the first whole turn with a predetermined speed(First exposure) is smaller than that in the second whole turn with a predetermined different speed(Second exposure). In FIG. 4(a), there is a time interval between the end of the first turn and the start of the second turn, that is to say, the turning motion is stopped for a short time(from a time A to B) after the first turn. In FIG. 4(b), there is no time interval between the end of the first turn and the start of the second turn, that is to say, the turning motion is not stopped after the first turn.

Specifically, by using a positive photoresist of phenol novolack type with a thickness of 2 $\mu$m, the illumination intensity is set to 200 mW/cm$^2$ during the first exposure and 2000 mW/cm$^2$ during the second exposure. However, the illumination intensity in each exposure, exposure time of one turn and turning speed of course vary depending on the material of the photoresist.

In the above embodiment, by effecting exposure with the wafer temperature held at 100° C., no bubbles are generated even if the illumination intensity for the first exposure is up to 500 mW/cm$^2$. In this case, the exposure time for the first exposure can be reduced to about one-third. This is the reason why, the gases produced in the the exposure are quickly dispersed in the photoresist material and emitted to the outside thereof, when the photoresist is heated.

The temperature for heating should be less than the heat-resistance of the photoresist.

Further, instead of turning the wafer 2 or more cycles as in the above embodiment, pluralizing optical fiber light guides may be used with the relationship of back and forth along a peripheral part of the wafer. In this case, it is important to set the illumination intensity of the first light guide to be lower than that of the second lightguide so that no bubbles will be formed in the photoresist in the first exposure. The time interval between the first exposure and the second exposure at any portion of a peripheral part of the wafer depends upon the distance between the first light guide and the second lightguide, and depends upon the turning speed of the wafer.

As an illumination control means, it is possible to control power supply to the lamp, or to use a dichroic mirror or filter in addition to the use of the light-reducing filter.

What is claimed is:

1. A method of exposing a peripheral part of a wafer on which a photoresist is coated comprising the steps of:
   exposing said peripheral part of said wafer to light guided by single optical fiber light guide at a first illumination intensity while turning said wafer, said first illumination is a low level so that gases are generated in said photoresist and are emitted outside the photoresist without forming bubbles therein;
   exposing a same area of said wafer to light guided by said single optical fiber light guide at a second illumination intensity which is higher than the first illumination intensity, so that gases are generated in said photoresist and are emitted outside the photoresist without forming bubbles therein, while again continuously turning said wafer, wherein any small portion of small peripheral part of said wafer is twice exposed in a time interval; and
   developing said photoresist on said peripheral part of said wafer.

2. A method of exposing a peripheral part of a wafer on which a photoresist is coated comprising the steps of:
   exposing said peripheral part of said wafer to light guided by first and second optical fiber light guides with relationship of back and forth along said peripheral part while turning said wafer, wherein an illumination intensity at a first exposure level of the first optical fiber light guide is lower than an illumination intensity at a second exposure level of the second optical fiber light guide and both illumination intensities have different exposure levels so that gases are generated in said photoresist and are emitted outside the photoresist without forming bubbles therein; and
   developing said photoresist on said peripheral part of said wafer.

3. A method of exposing a peripheral part of a wafer on which a photoresist is coated as claimed in claims 1 or 2 wherein said wafer is held in a heated state.

* * * * *

UNITED STATES PATENT AND TRADEMARK OFFICE
CERTIFICATE OF CORRECTION

PATENT NO. : 5,204,224
DATED : April 20, 1993
INVENTOR(S) : ARAI et al

It is certified that error appears in the above-identified patent and that said Letters Patent is hereby corrected as shown below:

On the cover page, item [75], please add the first inventors' name --Tetsuji ARAI--; and On title page, item [19], "Suzuki" should read --Arai et al.--

Signed and Sealed this

Seventh Day of December, 1993

Attest:

BRUCE LEHMAN

Attesting Officer

Commissioner of Patents and Trademarks